United States Patent [19]

Hirano et al.

[11] Patent Number: 5,405,285

[45] Date of Patent: Apr. 11, 1995

[54] MACHINING ERROR CORRECTION APPARATUS

[75] Inventors: Yoshihiro Hirano; Atsushi Ozaki, both of Annaka, Japan

[73] Assignee: Shin-Etsu Handotai Co., Ltd., Tokyo, Japan

[21] Appl. No.: 187,769

[22] Filed: Jan. 28, 1994

[30] Foreign Application Priority Data

Jan. 28, 1993 [JP] Japan .................................. 5-012878

[51] Int. Cl.⁶ .............................................. B24B 1/02
[52] U.S. Cl. ...................................... 451/1; 125/13.02; 451/70; 451/178; 451/9; 451/11; 451/41; 451/57; 451/54
[58] Field of Search ............... 51/5 R, 5 B, 5 C, 73 R, 51/72 R, 79, 88, 103 R, 106, 165 R, 165.71, 165.75, 165.76, 165.77, 236, 283 R, 283 E, 323, 326; 125/12, 13.02, 13.01

[56] References Cited

U.S. PATENT DOCUMENTS

| | | | |
|---|---|---|---|
| 4,084,354 | 4/1978 | Grandia et al. | 51/283 R |
| 4,773,951 | 9/1988 | Moffatt et al. | 51/283 R |
| 4,896,459 | 1/1990 | Brandt | 51/5 C |
| 5,074,276 | 12/1991 | Katayama | 51/283 R |

*Primary Examiner*—Bruce M. Kisliuk
*Assistant Examiner*—Eileen P. Morgan
*Attorney, Agent, or Firm*—Browdy and Neimark

[57] ABSTRACT

The diameter, the orientation flat width/notch depth and the length of the block $10p$ are measured by the measuring devices $71a$, $71b$ and $71c$ respectively and then the machining errors $\Delta Dp$, $\Delta Wp$ and $\Delta Lp$ in the measured values against the set values are calculated at the error calculation unit 833. Then $\Delta Dp$, $\Delta Wp$ and $\Delta Lp$ are stored in memory at the memory unit 834 in correspondence with the identification codes IDi and IDj of the grinding device $5i$ ($i=1-N$) and the cutting device $6j$ ($j=1-M$) that performed the machining. Then at the average value calculation unit 835, the average values of $\Delta Dp$ and $\Delta Wp$ for each of the grinding devices 51–5N and the average value of the $\Delta Lp$ for each of the cutting devices 61–6M are calculated. The average values of $\Delta Dp$ and $\Delta Wp$ are supplied to the corresponding grinding device $5i$ as the diameter correction value and the width/depth correction value respectively and the average value of $\Delta Lp$ is sent to the corresponding cutting device $6j$ as the length correction value from the transmission unit 836.

3 Claims, 7 Drawing Sheets

MACHINING ERROR CORRECTION APPARATUS

BACKGROUND OF THE INVENTION

1. Field of the Invention

The present invention relates to a machining error correction apparatus that automatically corrects machining errors in a plurality of grinding devices each of which cylindrically grinds the circumferential surface of the semiconductor ingot and which also grinds part of the circumferential surface along the direction of the axis to form an orientation flat or notch and that automatically corrects machining errors in a plurality of cutting devices each of which cuts the semiconductor ingot at alight angle to its axis.

2. Description of the Prior Art

A semiconductor ingot that has been formed as a single crystal is cut into blocks of a set length by cutting devices and is then cylindrically ground by grinding devices until its outer circumferential surface attains a set diameter. The grinding device also grinds a part of the outer circumferential surface in the direction of the axis to form an orientation flat of a set width or a notch of a set depth.

In the prior art, for each one of the plurality of cutting devices, one block is taken periodically to measure the machining error in length and then the operator performs correction for that particular cutting device. Likewise, for each of the grinding devices one block is periodically taken to measure the machining error in diameter and in width of orientation flat or in depth of notch and the operator performs correction on the relevant grinding device.

However, it is time consuming to perform such corrections as described above for each of the cutting devices and grinding devices. Also, even when the machining error is obtained for a single block, it is very possible that incidental machining errors will occur and, therefore, such corrections will not be accurate. Also, if a correction apparatus is to be provided for each cutting device and each grinding device, the entire structure of the system becomes complicated and corrections cannot be made efficiently.

SUMMARY OF THE INVENTION

Accordingly, an object of the present invention is to provide a machining error correction apparatus that can correct machining errors of grinding devices and cutting devices automatically, accurately and efficiently by addressing the aforementioned problems.

To this end, according to the present invention, there is provided a machining error correction apparatus for automatically correcting machining errors in a plurality of grinding devices each of which cylindrically grinds a circumferential surface of a semiconductor ingot by employing a diameter correction value so that a diameter of the ingot will attain a set value of Dsp, and which also grinds a part of said circumferential surface along a direction of an axis by employing a width/depth correction value so that an orientation flat with its width at a set value of Wsp, or a notch with its depth at a set value of Wsp can be formed on each the semiconductor ingot, and, for automatically correcting machining errors in a plurality of cutting devices each of which cuts the semiconductor ingot at a right angle to its axis by employing a length correction value so that a block of the semiconductor ingot with its length at a set value of Lsp is formed, comprising: a device for measuring a diameter of the block, a width of the orientation flat or a depth of the notch and a length of the block, means for calculating a machining error $\Delta Dp$, which is the error in the measured diameter Dp against said set value Dsp, a machining error $\Delta Wp$ which is the error in the measured width or depth Wp against the set value Wsp and a machining error $\Delta Lp$ which is the error in the measured length Lp against the set value Lsp, means for storing the machining errors $\Delta Dp$, $\Delta Wp$ and $\Delta Lp$ in correspondence with said grinding device and said cutting device that performed machining operation, means for calculating an average value of the machining errors $\Delta Dp$ and an average value of the machining errors $\Delta Wp$ for each of the plurality of grinding devices and for calculating an average value for the machining errors $\Delta Lp$ for each of the plurality of cutting devices, and means for transmitting the average value of machining errors in diameter as the diameter correction value and the average value of machining errors in width or depth as the width/depth correction value to the corresponding grinding device and for transmitting the average value of machining errors in length as the length correction value to the corresponding cutting device.

According to the present invention, machining errors in a plurality of grinding devices and cutting devices can be automatically and accurately corrected. Also, since the time required to measure the diameter, the width of the orientation flat or the depth of the notch and the length of one block 10p is generally shorter than the grinding and cutting time required to obtain one block 10p, it is possible to correct machining errors for a plurality of grinding devices and cutting devices with one measuring device, resulting in improved efficiency.

BRIEF DESCRIPTION OF THE DRAWINGS

FIGS. 6(A-D) is an explanatory diagram of the grinding process; and

FIG. 7(A-E) is an explanatory diagram of the cutting process.

DETAILED DESCRIPTION OF THE PREFERRED EMBODIMENT

A preferred embodiment of the present invention will be described below in reference to the figures.

First, the processing steps illustrated in FIGS. (A) to 6(D) are performed with one grinding device for one semiconductor ingot and then the processing steps as indicated in FIGS. 7(A) to 7(E) are performed in the given order with one cutting machine.

Figure 3:
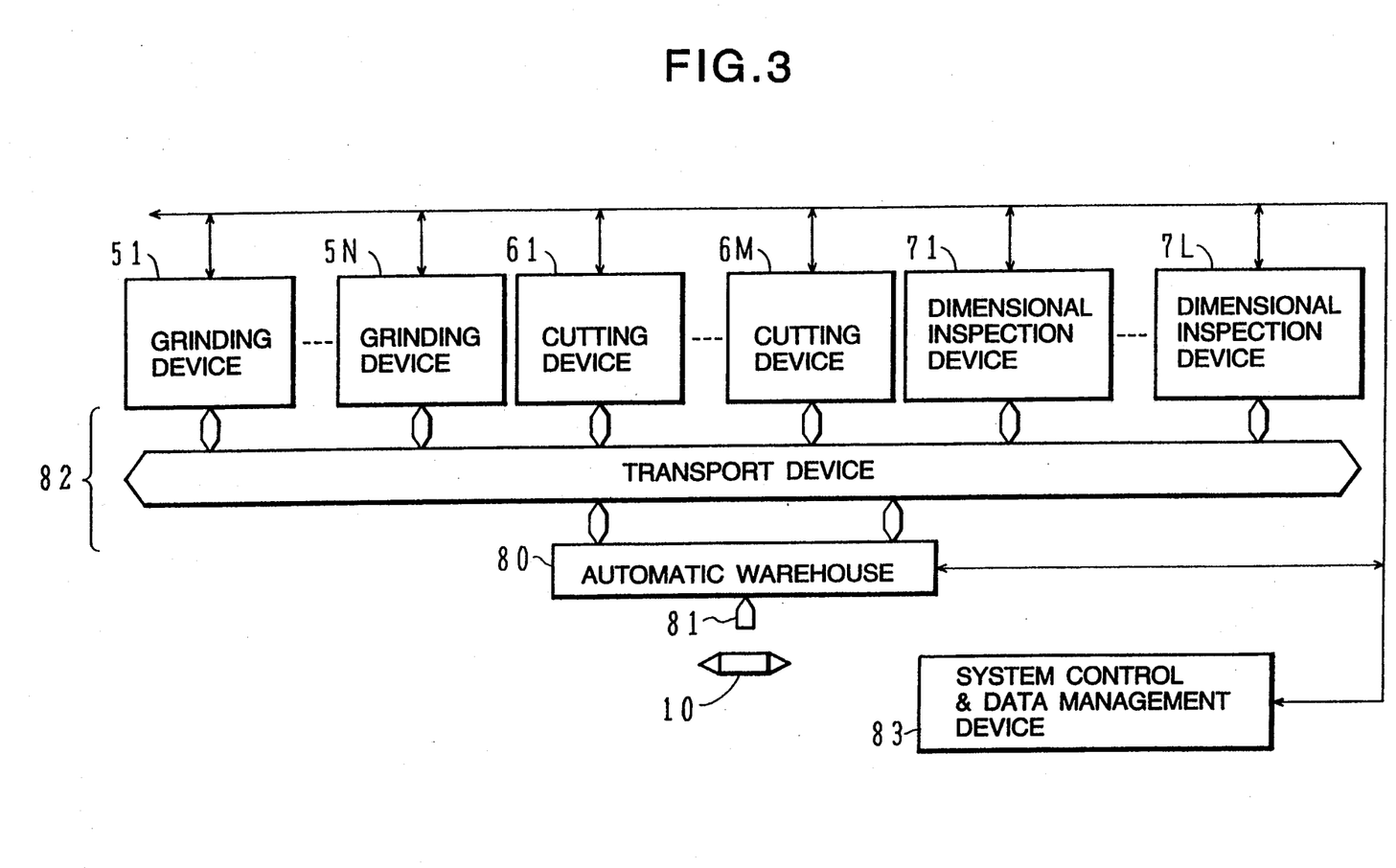
FIG. 3 is a block diagram illustrating an automated grinding and cutting system for semiconductor ingots including the structure shown in FIG. 1.

These processing steps are executed in a fully automated system as illustrated in FIG. 3. This system is equipped with N grinding devices; 51-5N, M cutting devices; 61-6M, L dimensional inspection devices; 71-7L and an automatic warehouse 80, a transport device 81 for delivering formed semiconductor ingots 10 to the automatic warehouse 80, and the transport device 82 for transporting the semiconductor ingots between the grinding devices 51-5N, the cutting devices 61-6M, the dimensional inspection devices 71-7L and the automatic warehouse 80. The operational details of each device are controlled by a local controller, not shown in the figures, provided in each device. The control and data management for the entire system are performed by the system control & data management device 83.

In order to simplify overall control for efficient functioning, the following expedients are employed:

(1) Between the automatic warehouse 80 and the system control & data management device 83, only data exchange is performed; selection of semiconductor ingots to be sent out to meet requests is made at the automatic warehouse 80. The automatic warehouse 80 performs first-in, first-out FIFO processing of requests for receiving and dispatching ingots.

Figure 4:
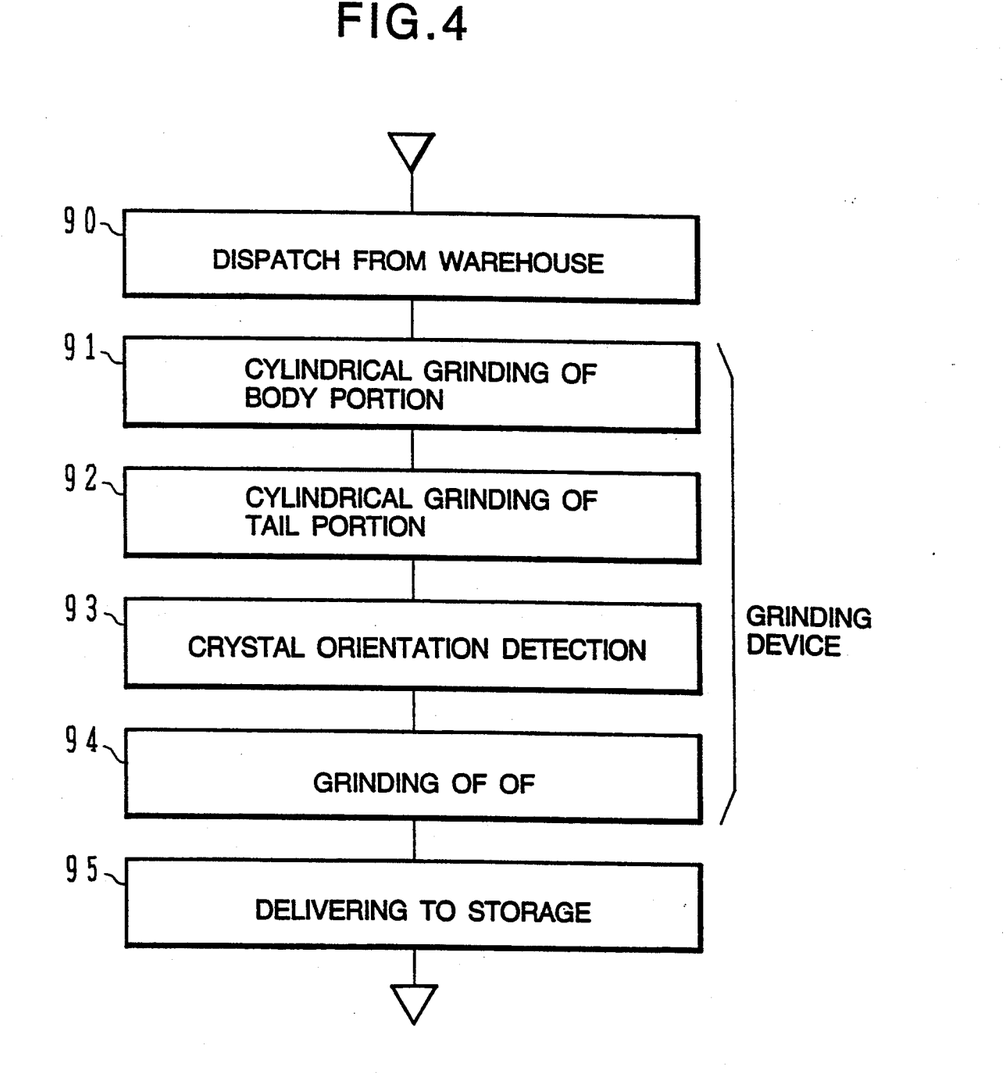
FIG. 4 is a flow chart illustrating the grinding process.

(2) Control of the grinding devices 51-5N and the automatic warehouse 80 is implemented as shown in FIG. 4.

Figure 5:
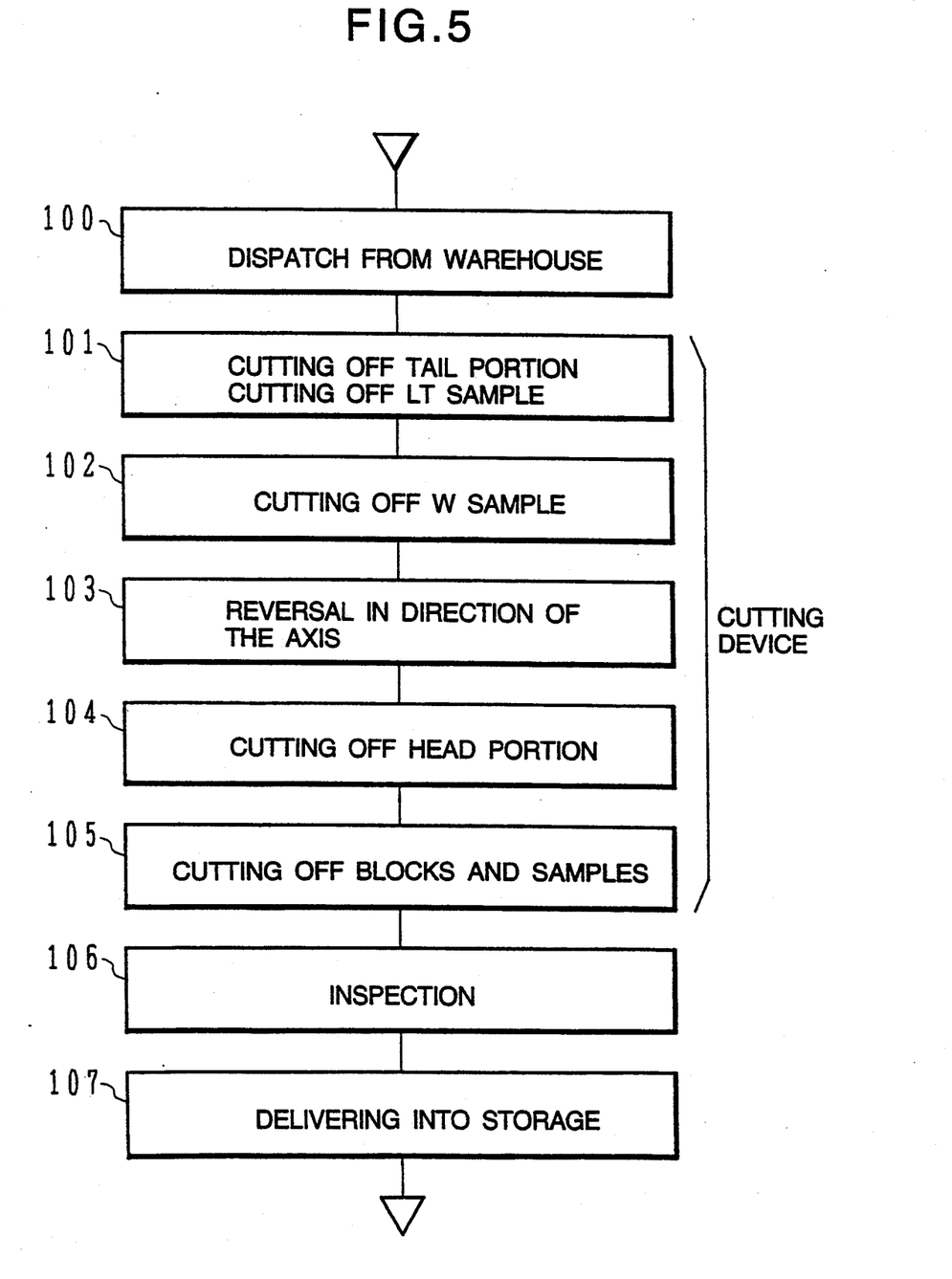
FIG. 5 is a flow chart illustrating the cutting and inspection process.

(3) Control of the cutting devices 61-6M, the dimensional inspection devices 71-7L and the automatic warehouse 80 is performed as shown in FIG. 5, independent of the control system shown in FIG. 4.

Figure 6:
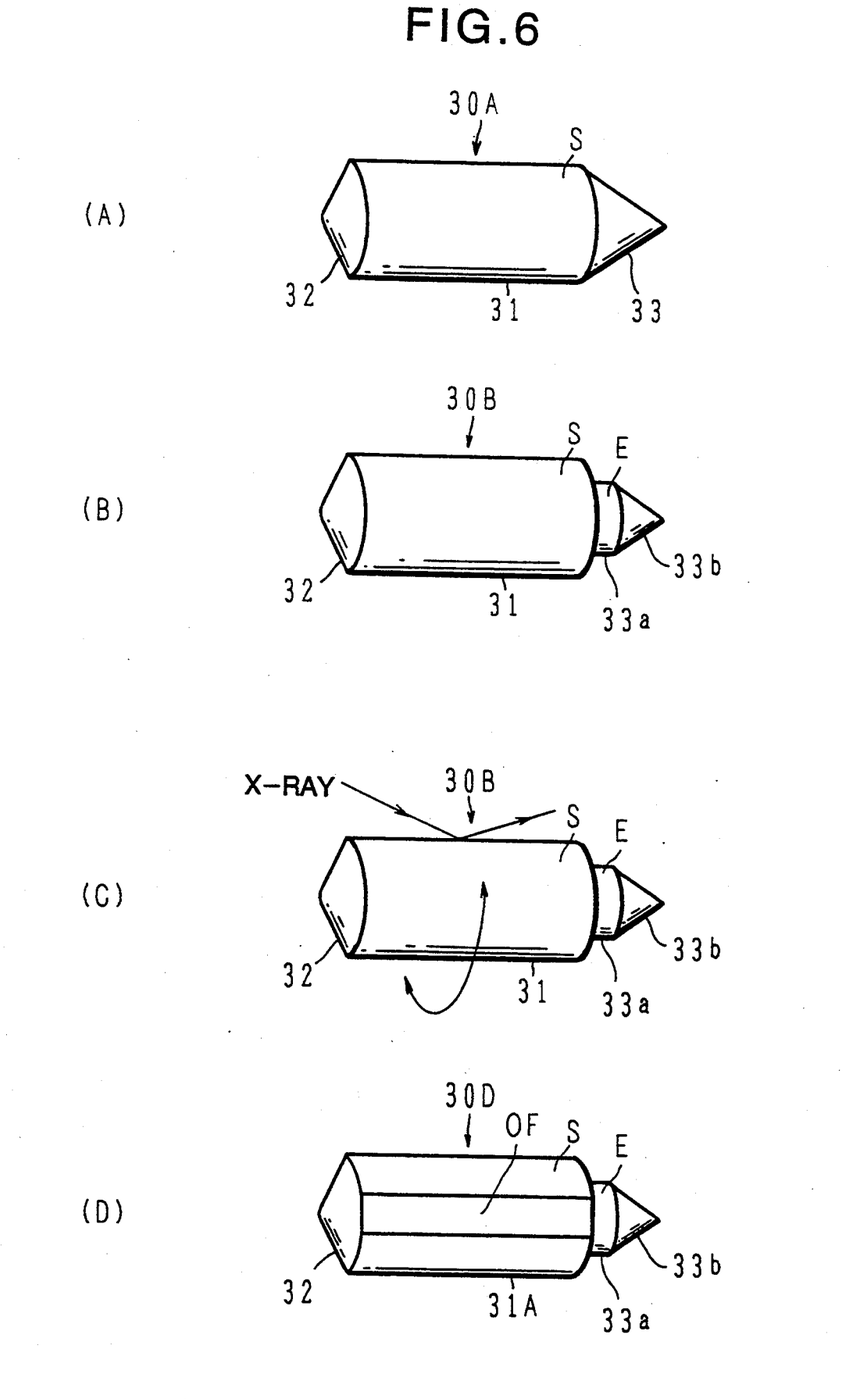

Next, the processing steps shown in FIG. 4 are explained in reference to FIGS. 6 and 3. Hereafter, the numerals in parenthesis indicate the step identification numbers used in the FIGS. FIGS. 6(A) to (D) correspond with steps 91-94 in FIG. 4 respectively.

(90) The grinding devices 51-5N issue requests for unprocessed semiconductor ingots 10 to the automatic warehouse 80 independently of one another. The automatic warehouse 80, in response to these requests, dispatches the semiconductor ingots 10. The transport device 82 delivers a semiconductor ingot 10 to the requesting grinding device 5i (i=1 to N) and hands it over.

(91) The grinding device 5i aligns and mounts the semiconductor ingot 10, rotates it around its axis and cylindrically grinds the circumference of the cylindrical body portion by pressing the grindstone down onto it and moving it parallel to the axis of the semiconductor ingot 10. With this, the semiconductor ingot 30A as illustrated in FIG. 6(A) is obtained. The semiconductor ingot 30A comprises a cylindrical body portion 31, a cone-shaped head portion 32 and a cone-shaped tail portion 33 at both ends. A setting value for the diameter of the cylindrical body portion 31 is output by the system control & data management device 83.

(92) In order to acquire a sample for lifetime measurement and to set the cut surface of the tail portion 33 at a right angle to the inner diameter blade, the circumference on the side of the cylindrical body portion 31 of the tail portion 33 is cylindrically ground over a length of, for example, 10 mm, to form the smaller-diameter section 33a as shown in FIGS. 6(A) and (B). This processing step is executed only at a request from the system control & data management device 83.

(93) In order to determine the azimuth reference position, the grinding device 5i is equipped with an x-ray radiation device that can irradiate the cylindrical body portion 31 with x-rays at an arbitrary entry angle and a detector that detects the diffracted rays. The grinding device 5i irradiates the outer circumference surface S of the cylindrical body portion 31 with x-rays at a specific entry angle while the semiconductor ingot 30B is rotated around its axis, and it determines the azimuth reference position based upon the rotating position of the semiconductor ingot 30C when it identifies the position of peak intensity of the diffracted rays.

(94) The rotation of the semiconductor ingot 30C is stopped at an appropriate angular position and the grindstone is pressed down onto the semiconductor ingot 30C at the determined azimuth reference position and by grinding the semiconductor ingot 30C by moving the grindstone parallel to the axis of the semiconductor ingot 30C, an orientation flat OF as shown in FIG. 6 (D) or a notch not shown is formed. The setting value for the width of the orientation flat OF or the depth of the notch is received as an instruction from the system control & data management device 83.

(95) The semiconductor ingot 30D that has been thus ground is now detached from the grinding device 5i and handed over to the transport device 82. The transport device 82 delivers it to the automatic warehouse 80. On receiving it, the automatic warehouse 80 stores it as a product with grinding processing completed.

Figure 7:
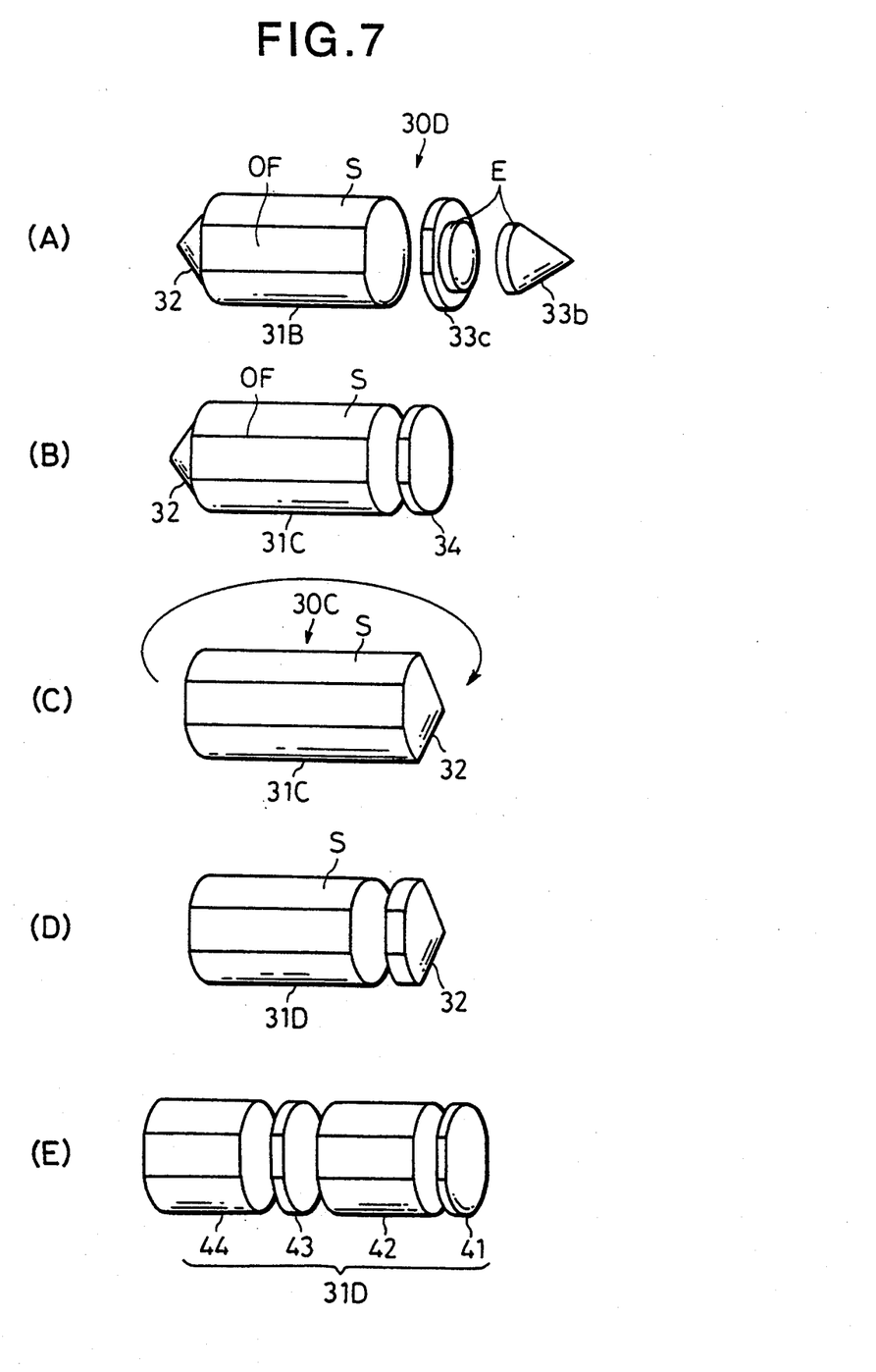

Next, the processing steps shown in FIG. 5 are explained in reference to FIGS. 7 and 3. FIGS. 7(A) to (E) correspond with steps 101 to 105 in FIG. 5 respectively.

(100) The cutting devices 61-6M issue requests to the automatic warehouse 80 for semiconductor ingots 30D that have been ground as described above, independently of one another. The automatic warehouse 80, in response to these requests, dispatches the semiconductor ingots 30D. The transport device 82, delivers the semiconductor ingot 30D to the requesting cutting device 6i (i=1 to M) and hands it over.

(101) The cutting device 6j secures the semiconductor ingot 30D and cuts off the tail portion 33b as shown in FIG. 7(A). Then it cuts off a sample 33c for lifetime measurement. The tail portion 33b is cut to the outer circumference surface E. The cutting position, including ones below-described, is output by the system control & data management device 83.

(102) A wafer sample 34 is cut off from the cylindrical body portion 31B as illustrated in FIGS. 7(A) and (B). The wafer sample 34 is then transported and stored in a wafer cassette not shown in the figures. The number 31C indicates the excess material left over after wafer sample 34 is cut off from the cylindrical body portion 31B.

(103) The semiconductor ingot 30C is reversed in the direction of the axis as shown in FIG. 7(C). This reversing procedure is for transporting the cut items to be further explained later in the same direction.

(104) Next, as shown in FIG. 7(D), the head portion 32 of the semiconductor ingot 30C is cut off to obtain the cylindrical body portion 31D.

(105) As shown in FIG. 7(E), a wafer sample 41 is cut from the end of the cylindrical body portion 31D on the side of the head portion. Then, from the middle portion of the cylindrical body portion 31D a wafer sample 43 is cut out to obtain blocks 42 and 44. The wafer samples 41 and 43 are stored in the aforementioned wafer cassette and the blocks 42 and 44 are delivered to the dimensional inspection device 7k (k=1 to L) which has issued the request or which is the least backed-up, by the transport device 82. The set value of the cutting position of the wafer sample 43 is substantially equal to that of the length of the blocks 42 and 43.

(106) The dimensional inspection device 7k receives the blocks 42 and 44 and measures their length and diameter as well as the width of the orientation flat OF or the depth of the notch and sends these data to the system control & data management device 83. The wafer samples 41 and 43 along with the aforementioned wafer sample 34 are inspected for their crystal properties by a device not shown in the figures.

(107) After the dimensional inspection, the blocks 42 and 44 are delivered to the automatic warehouse 80 by the transport device 82, and the automatic warehouse 80 receives and stores them.

Figure 1:
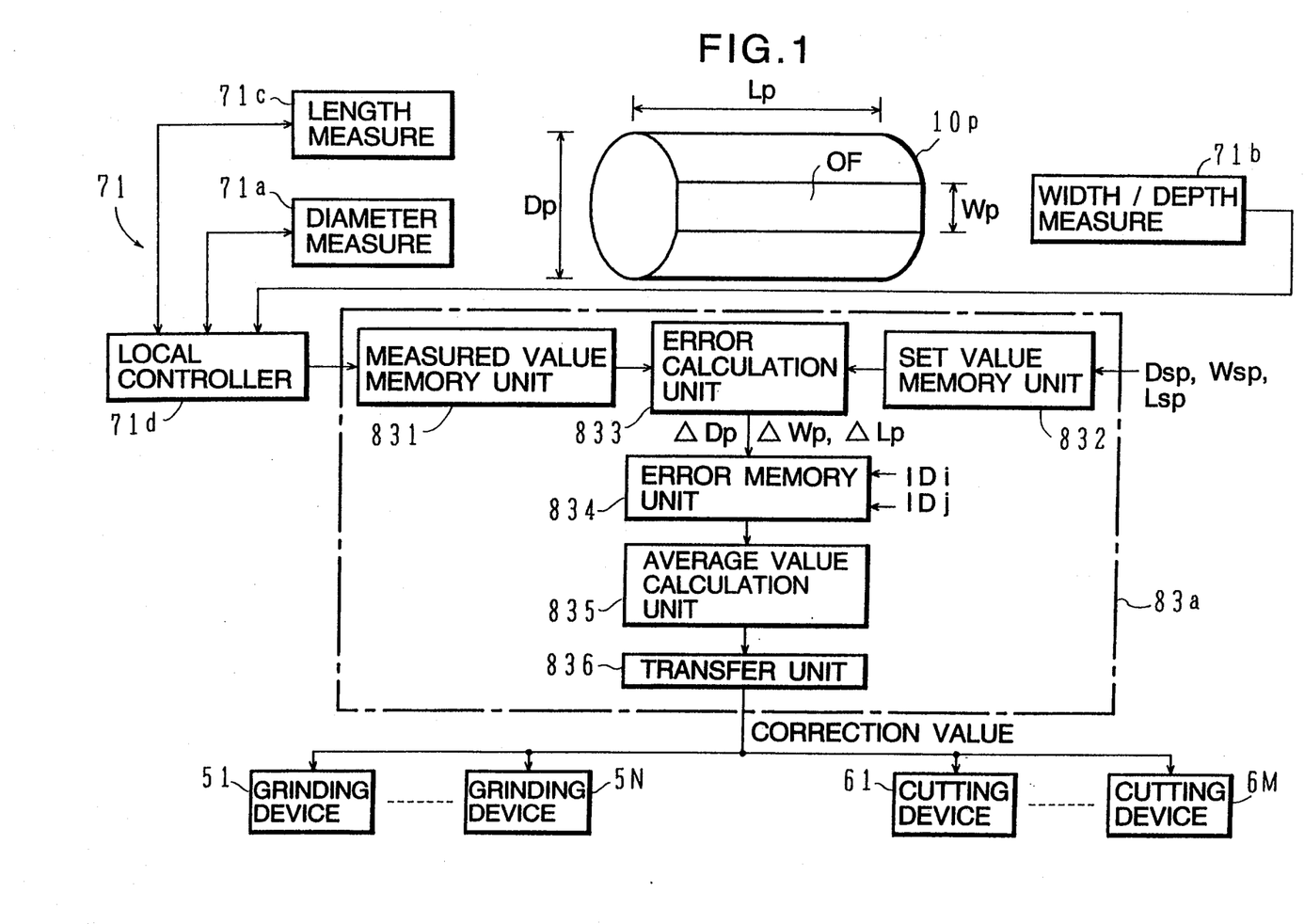
FIG. 1 is a block diagram of one embodiment of the machining error correction apparatus according to the present invention.

Next, the machining error correction apparatus for the grinding devices 51-5N and the cutting devices 61-6M is explained. FIG. 1 shows the machining error correction apparatus extracted from FIG. 3, in the case of L=1. Since, the time required to measure the diameter, the width of the orientation flat or the depth of the notch and the length for one block 10p is generally shorter than the grinding and cutting time required to obtain one block 10p, it is possible to correct machining errors in a plurality of grinding devices and cutting devices with one measuring device. Note that when L≧2, the situation is identical to when L=1.

The dimensional inspection device 71 is provided with a diameter measuring device 71a that measures the diameter Dp of the block 10p, a width/depth measuring device 71b that measures the width Wp of the orientation flat OF or the depth Wp of the notch of the block 10p, a length measuring device 71c that measures the length Lp of the block 10p and the local controller 71d. The local controller 71d sends measuring instructions to the diameter measuring device 71a, the width/depth measuring device 71b and the length measuring device 71c, and receives the measured values Dp, Wp and Lp from the diameter measuring device 71a, the width depth measuring device 71b and the length measuring device 71c respectively. Then it sends them to the machining error correction value calculation & transmission section 83a. The diameter measuring device 71a, width/depth measuring device 71b and the length measuring device 71c detect the diameter Dp, the orientation flat width or the notch depth Wp and the length Lp respectively by, for example, photographing the block 10p with a CCD camera and then by processing the image.

Figure 2:
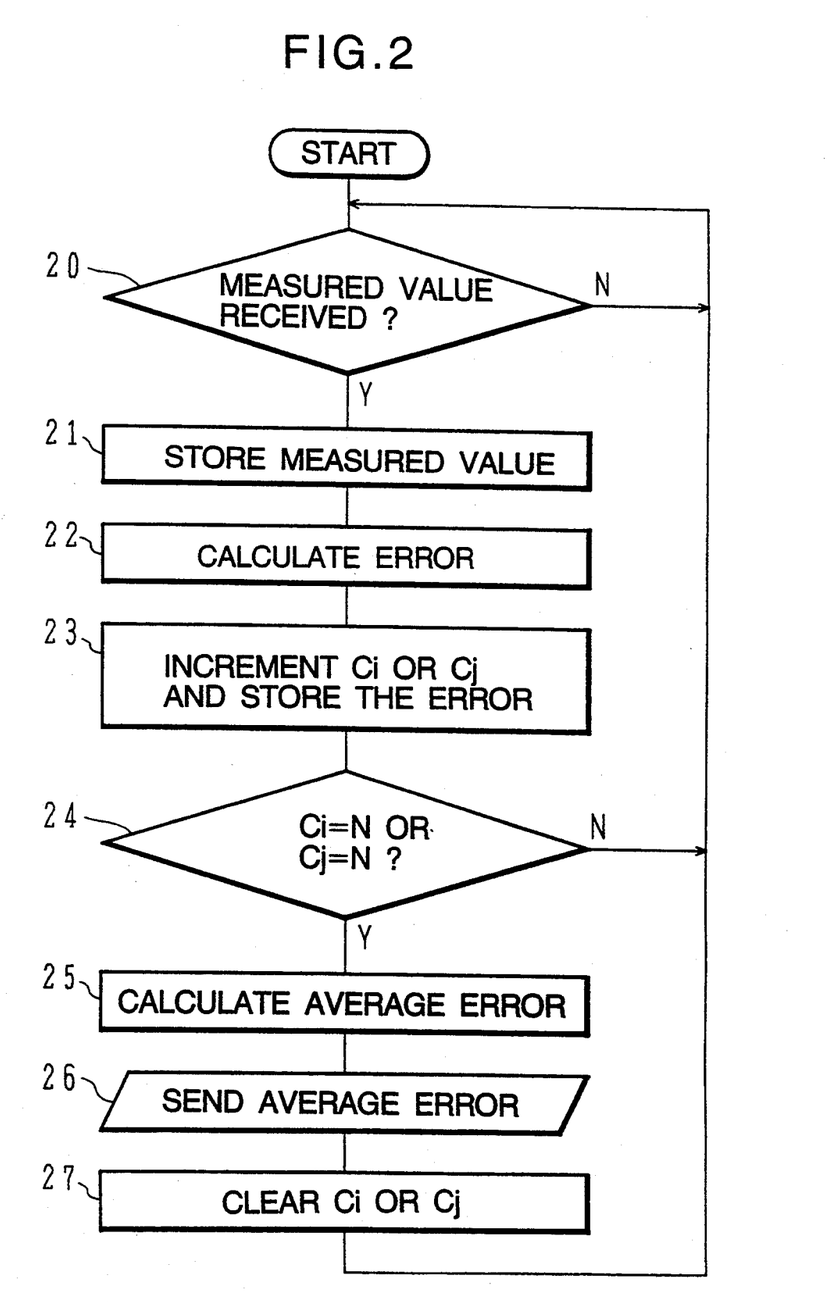
FIG. 2 is a flow chart illustrating the processing performed by the machining error calculation & transmission section in FIG.

The machining error correction value calculation & transmission section 83a is expressed as a partial functional block of the structure of the system control & data management device 83 in FIG. 3 and is constituted by a microcomputer. FIG. 2 shows the processing performed by the machining error correction value calculation & transmission section 83a.

(20, 21) When the machining error correction value calculation & transmission section 83a receives the diameter Dp, the orientation flat width or notch depth Wp and the length Lp from the local controller 71d, these values are temporarily stored in the measured value memory unit 831. Meanwhile, the set values Dsp, Wsp and Lsp for the diameter, orientation flat width or notch depth and length of the block 10p are written in advance in the set value memory unit 832 by the operator via a keyboard (not shown).

(22) The machining error calculation unit 833 calculates the machining errors $\Delta Dp = Dp - Dsp$, $\Delta Wp = Wp - Wsp$ and $\Delta Lp = Lp - Lsp$ for the diameter, the orientation flat width or notch depth and length respectively and writes them in the error memory unit 834 by corresponding them with the identification codes IDi and IDj of the grinding device 5i (i=1-N) and the cutting device 6j (j=1-M) respectively that machined the block 10p. The identification codes IDi and IDj have been sent to the system control & data management device 83 at the beginning of machining from the grinding device 5i and cutting device 6j assigned perform the machining on block 10p.

(23-25) The average value calculation unit 835 increments the soft counters Ci and Cj that correspond with the identification codes IDi and IDj and when Ci=n or Cj=n, it calculates the average value of n number of machining errors that correspond with the identification code IDi or IDj and then sends it to the transmission unit 836. The initial value of both the soft counters Ci and Cj is 0. If Ci≠n and at the same time Cj≠n, the operation goes back to step 20 above.

(26) The transmission unit 836 supplies this average value as the correction value to the grinding device 5i or the cutting device 6j that is identified with the identification code IDi or IDj. Upon receiving the correction value, the grinding device 5i or the cutting device 6j performs machining with a value that is the set value minus the correction value as the target value, thus correcting the machining error.

(27) The soft counter Ci or Cj in which the value has reached n is cleared to 0 and the operation goes back to step 20 above.

In this manner, corrections on machining errors on the grinding devices 51-5N and the cutting devices 61-6M are implemented automatically and accurately.

Having described a specific embodiment of the present invention, it is to be understood that modification and variation of the invention are possible without departing from the spirit and scope thereof.

What is claimed is:

1. A machining error correction apparatus for automatically correcting machining errors in a plurality of grinding devices (51-5N) each of which cylindrically grinds a circumferential surface of a semiconductor ingot by employing a diameter correction value so that a diameter of the ingot will attain a set value of Dsp, and which also grinds a part of said circumferential surface along a direction of an axis by employing a width/depth correction value so that an orientation flat (OF) with its width at a set value of Wsp, or a notch with its depth at a set value of Wsp can be formed on each the semiconductor ingot, and, for automatically correcting machining errors in a plurality of cutting devices (61-6M) each of which cuts the semiconductor ingot at a right angle to its axis by employing a length correction value so that a block (10p) of the semiconductor ingot with its length at a set value of Lsp is formed, comprising:

a device (71a, 71b, 71c) for measuring a diameter of the block, a width of the orientation flat or a depth of the notch and a length of the block, means (831-833) for calculating a machining error $\Delta Dp$, which is the error in the measured diameter Dp against said set value Dsp, a machining error $\Delta Wp$ which is the error in the measured width or depth Wp against the set value Wsp and a machining error $\Delta Lp$ which is the error in the measured length Lp against the set value Lsp, means (834) for storing the machining errors $\Delta Dp$, $\Delta Wp$ and $\Delta Lp$ in correspondence with said grinding device and said cutting device that performed machining operation, means (835) for calculating an average value of the machining errors $\Delta Dp$ and an average value of the machining errors $\Delta Wp$ for each of the plurality of grinding devices and for calculating an average value for the machining errors ΔLp for each of the plurality of cutting devices, and means (836) for transmitting the average value of machining errors in diameter as the diameter correction value and the average value of machining errors in width or depth as the width/depth correction value to the corresponding grinding device and for transmitting the average value of machining errors in length as the length correction value to the corresponding cutting device.

2. A machining error correction apparatus according to the claim 1, further comprising:

an automatic warehouse (80) for dispatching and storing the semiconductor ingot in response to a request;

a device (82) for transporting the semiconductor ingot between the automatic warehouse and the grinding devices (51–5N), and from the automatic warehouse to each of the cutting devices (61–6M), from each of the cutting devices to the measuring device (71–7L) and from the measuring device to the automatic warehouse;

3. A machining error correction apparatus according to the claim 2 wherein each of the grinding devices issues requests for dispatching the unprocessed semiconductor ingot and storing the ground semiconductor ingot to the automatic warehouse, and each of the cutting devices issues requests for dispatching the ground semiconductor ingot to the automatic warehouse.

* * * * *